(12) United States Patent
Gallo et al.

(10) Patent No.: US 7,064,582 B2
(45) Date of Patent: Jun. 20, 2006

(54) OUTPUT BUFFER STRENGTH TRIMMING

(75) Inventors: Girolamo Gallo, Avezzano (IT); Giulio Marotta, Contigliano (IT); Giovanni Naso, Frosinone (IT)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 10/701,090

(22) Filed: Nov. 4, 2003

(65) Prior Publication Data

US 2004/0145388 A1    Jul. 29, 2004

(30) Foreign Application Priority Data

Jan. 27, 2003  (IT)  ............ RM2003A0029

(51) Int. Cl.
*H03K 17/16* (2006.01)

(52) U.S. Cl. ........................... 326/87; 326/83

(58) Field of Classification Search ............ 326/26–28, 326/83–87, 82
See application file for complete search history.

(56) References Cited

U.S. PATENT DOCUMENTS

| | | | | |
|---|---|---|---|---|
| 4,680,487 A | * | 7/1987 | Kobayashi | 326/87 |
| 4,719,369 A | * | 1/1988 | Asano et al. | 326/30 |
| 5,216,289 A | * | 6/1993 | Hahn et al. | 327/108 |
| 5,352,939 A | * | 10/1994 | Hirabayashi et al. | 326/83 |
| 5,387,824 A | * | 2/1995 | Michelsen | 326/83 |
| 5,977,790 A | * | 11/1999 | Sanwo et al. | 326/27 |
| 6,097,219 A | | 8/2000 | Urata et al. | |
| 6,177,810 B1 | | 1/2001 | Loeffler | |
| 6,314,011 B1 | | 11/2001 | Keeth et al. | |
| 6,373,287 B1 | * | 4/2002 | Matsumoto | 326/87 |
| 6,476,638 B1 | | 11/2002 | Zhou et al. | |
| 6,489,807 B1 | | 12/2002 | Genna et al. | |
| 6,549,036 B1 | | 4/2003 | Lee | |
| 6,556,485 B1 | | 4/2003 | Shimizu et al. | |

* cited by examiner

*Primary Examiner*—Don Le
(74) *Attorney, Agent, or Firm*—Leffert Jay & Polglaze, P.A.

(57) ABSTRACT

Apparatus and methods for adjusting the buffer strength of an output buffer to match its capacitive load use selectively enabled stages of a multiple stage output buffer. A user can opt for a default capacitive load, or adjust the strength by enabling one or more stages of the multiple stage output buffer.

31 Claims, 5 Drawing Sheets

OUTPUT BUFFER STRENGTH TRIMMING

RELATED APPLICATION

This application claims priority to Italian Patent Application Ser. No. RM2003A000029, filed Jan. 27, 2003, entitled "OUTPUT BUFFER STRENGTH TRIMMING," which is commonly assigned.

TECHNICAL FIELD OF THE INVENTION

The present invention relates generally to buffer circuits and in particular the present invention relates to buffer circuits with adjustable strength.

BACKGROUND OF THE INVENTION

Integrated circuits are common in electronic products. Electronic products often are comprised of integrated circuits interfaced to each other via a data bus or other data paths. Interface specifications for various digital logic families delineate voltage and current levels required for digital signals to be transferred between two or more integrated circuits. Interface specifications are utilized by integrated circuits through the use of output buffer circuits to drive a logical low or logical high signal across a data path. In addition, output buffer circuits are a way of interfacing different digital logic families of integrated circuits.

Typically, output buffer circuits often use an external voltage level, $V_{ccq}$, as a source of the logic high level. Depending on the design, $V_{ccq}$ can range from 1.6 to 3.3 volts. Output buffer circuits generally use a system ground (GNDQ) as a sink for a logic low output. Output buffer circuits generally use two complementary transistor devices. The first device is a p-channel pull-up metal-oxide semiconductor (MOS) transistor, whose source is connected to $V_{ccq}$, and whose drain is connected to the output terminal. The second device is an n-channel pull-down MOS transistor, whose drain is connected to the output terminal, and whose source is connected to ground.

The output buffer of an integrated circuit must be sized large enough to provide sufficient sinking and sourcing to a load and to transmit a signal within a short time. This requirement can demand a high rate of change in the current used in the integrated circuit, and can cause significant noise due to power line voltage drops and/or ground voltage line bumps. This noise can upset nominal operation of the circuits that share a power/ground bus with the output buffers. In modern applications, where integrated circuits are assembled in very small printed circuit boards (PCBs) with specialized routing, the load that an integrated circuit must drive can be much smaller than the load used as reference to design the output driver size.

One example of an application of an output buffer is in a memory system. A memory system is commonly used in products such as digital cameras, personal digital assistants, cellular telephones, video game systems and the like. A typical memory system is used to store commands or data that will be used in conjunction with a microprocessor. With the development of faster and faster microprocessors, memory systems must also keep pace. Fast transition times are a factor in the design of increasing circuit speed. This is particularly true with respect to memory systems.

In some applications, a particular integrated circuit will be used in a variety of applications having a very wide range of output loads. For Flash memory circuits, the capacitive load is typically 30 picoFarads (pF). Most applications have loads much smaller than that. With a standard capacitive load, it is easy to size an output buffer during manufacture for a known standard capacitive load. However, since the variety of applications for which typical integrated circuits are used, a standard output buffer size is not sufficient. For example, with a strong output buffer and small load, overshoot and undershoot on output signals occurs. With a weak buffer, the buffer is insufficient to work with an application having a larger load.

Currently, many IC applications are quite sensitive to radio frequency (RF) interference, and the noise generated by a buffer harms the RF performance of the circuit board. This RF interference increases when the switching time of the loads is too fast, which occurs when the load is small.

For the reasons stated above, and for other reasons stated below which will become apparent to those skilled in the art upon reading and understanding the present specification, there is a need in the art for adjusting the strength of an output buffer according to the application for which it is to be used.

SUMMARY

The above-mentioned problems with output buffers and other problems are addressed by the present invention and will be understood by reading and studying the following specification.

For one embodiment, an output buffer includes a first stage and a second stage each having outputs connected parallel to one another. The first stage provides buffer strength when a first stage enable signal is active, and the second stage provides buffer strength when a second stage enable signal is active.

For another embodiment, an output buffer includes at least two parallel buffer stages, each stage activated upon receipt of a respective stage enable signal, the stages providing a range of output buffer strengths cumulatively to a total output buffer strength.

For yet another embodiment, an output buffer circuit includes a first output buffer stage for providing an output buffer strength in response to a first stage enable signal, and at least one second output buffer stage. Each second output buffer stage is adapted to selectively provide additional buffer strength in response to a respective second stage enable signal.

For yet another embodiment, an output buffer includes a first stage and a second stage connected parallel to each other. The first stage includes a first stage complementary metal oxide semiconductor (CMOS) structure having a p-channel MOS device and an n-channel MOS device, a first OR gate having an output connected to a gate of the p-channel transistor, and having two inputs, an input connected to a data signal and another input connected to an enable signal, and a first AND gate having an output connected to a gate of the n-channel transistor, and having two inputs, an input connected to the data signal and another input connected to the enable signal. The second stage includes a second stage CMOS structure having a p-channel MOS device and an n-channel MOS device, a second OR gate having an output connected to a gate of the p-channel transistor, and having two inputs, an input connected to a data signal and another input connected to an enable signal, and a second AND gate having an output connected to a gate of the n-channel transistor, and having two inputs, an input connected to the data signal and another input connected to the enable signal For still another embodiment, a memory device includes an array of memory cells, a number of data lines for access to the memory cells, and an output buffer coupled between the array of memory cells and the plurality of data lines. The output buffer includes a first stage and a second stage, the first and second stages having outputs connected parallel to one another, the first stage providing buffer strength when a first stage enable signal is active, and the second stage providing buffer strength when a second stage enable signal is active.

For still another embodiment, a method of adjusting an output buffer strength includes selectively enabling at least one output buffer stage in response to a predetermined set of enable signals for the respective stages.

For another embodiment, a method for adjusting a strength of an output buffer includes generating enable signals for a plurality of parallel output buffer stages, enabling each stage having an enable signal, and combining the strength of each enabled stage into a total buffer strength.

For another embodiment, a method of adjusting an output buffer strength includes selectively enabling at least one output buffer stage in response to a predetermined set of enable signals for the respective stages.

For another embodiment, a method of trimming an output buffer includes enabling at least one of a number of parallel connected output stages, and combining a strength of each of the enabled output stages into a total output buffer strength.

For yet another embodiment, a method of adjusting output buffer strength in a multiple stage output buffer includes selecting predetermined or programmable enable inputs for the output stages, programming the programmable enable inputs when programmable enable inputs are selected, and passing the predetermined enable inputs when predetermined enable inputs are selected.

For another embodiment, a method of operating an integrated circuit includes programming a selectable input fuse to generate an active selectable input enable signal, programming a predetermined enable signal set, programming a selectable input set, and selecting between the predetermined enable set and the selectable input set.

Further embodiments of the invention include methods and apparatus of varying scope.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

The various embodiments of the present invention provide apparatus and methods for adjusting the strength of an output buffer. This is accomplished by programming enable signals for each of a plurality of stages, and connecting the stages in parallel. Each enabled output stage adds to the strength of the output buffer, and the output buffer can be sized to accommodate a specified load.

Figure 1:
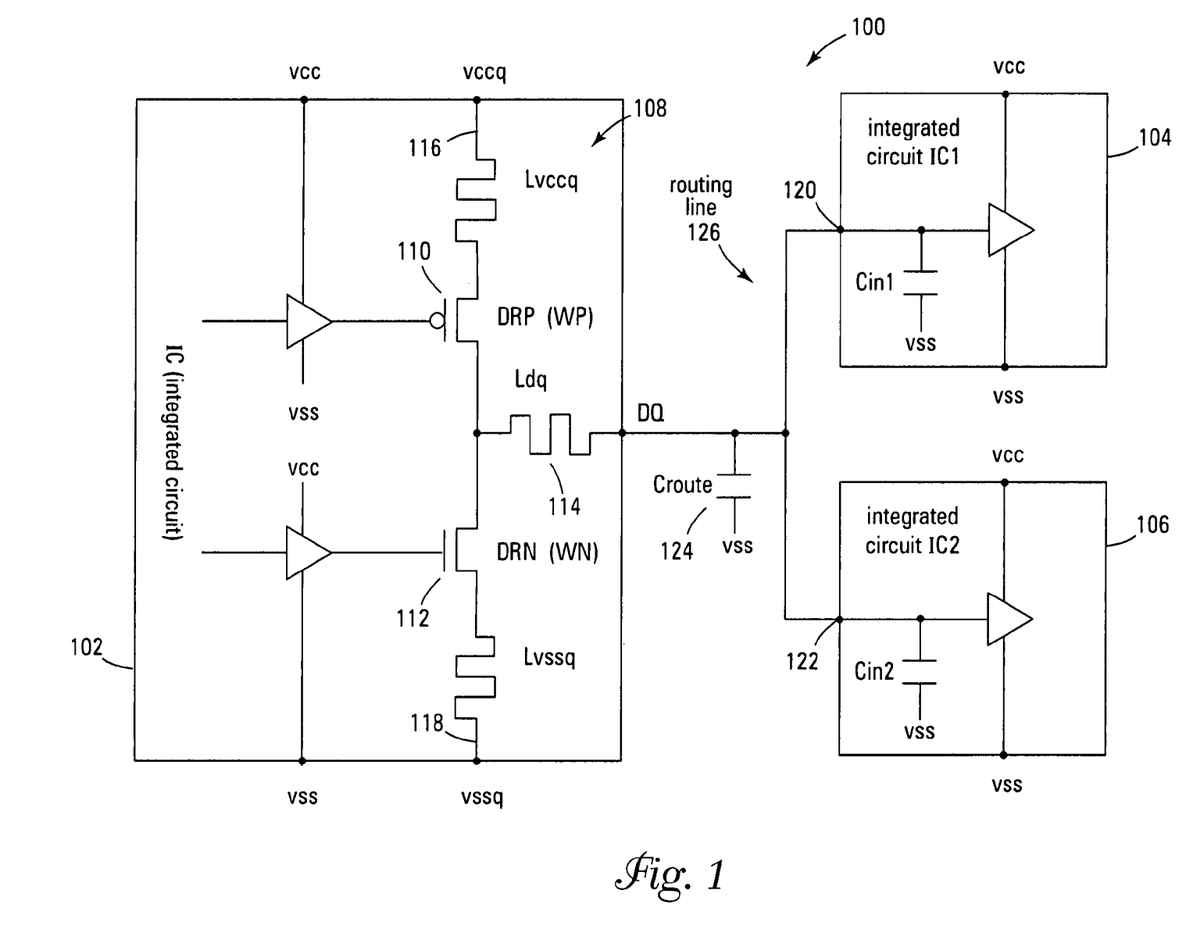
FIG. 1 is a block diagram of an integrated circuit on which embodiments of the present invention are practiced.

FIG. 1 is a block diagram 100 of an integrated circuit 102 driving two secondary integrated circuits 104 and 106. The integrated circuit 102 comprises an output driver 108. Output driver 108 is a complementary metal oxide semiconductor (CMOS) structure having a p-channel transistor 110 having a size WP and an n-channel transistor 112 having a size WN. The output driver transistors 110 and 112 are connected to an external data (DQ) pin by a bonding wire 114 having an inductance $L_{dq}$. Sources $V_{ccq}$ and $V_{ssq}$ are connected to external pads by bonding wires 116 and 118, respectively, having inductances $L_{vccq}$ and $L_{vssq}$. The total inductance L involved in the DQ rising is therefore $L=L_{dq}+L_{vccq}$. The total inductance L involved in the DQ falling is therefore $L=L_{dq}+L_{vssq}$. Integrated circuit 102 is connected to the inputs 120 and 122 of circuits 104 and 106 respectively.

When circuits 104 and 106 are MOS integrated circuits, their inputs load the output driver 108 with input capacitances $C_{in1}$ and $C_{in2}$. The routing capacitance on the routing line 126 between the DQ and circuits 104 and 106 is Croute 124. The routing capacitance load $C_{load}$ seen by the output driver is the sum of the capacitance of the routing line plus the input capacitances of circuits 104 and 106, $C_{load}=C_{route}+C_{in1}+C_{in2}$. Suppose ts is the rise and fall time of the routing line 126 that must be satisfied to have the system 100 working with satisfactory performance. The size ratio WP/WN is designed to have a rise/fall time shorter than ts for the specific $C_{load}$ of the circuit.

Upon a switching, a perturbation dv, which is typically a voltage drop on $V_{ccq}$ or a voltage bump on $V_{ssq}$, occurs on the power lines. The perturbation follows this equation:

$$dv \geq (4*C_{load}*V_{ccq}*L)/ts^2$$

For example, if $C_{load}$=100 pF, $V_{ccq}$=2 Volts (V), ts=2 nanoseconds (ns), and L=2 nanoHenries (nH):

$$dv \geq (4*100 \text{ pF}*2 \text{ V}*2 \text{ nH})/4 \text{ ns}=400 \text{ milliVolts } (mV)$$

A noise on the order of 400 mV on the $V_{ccq}$ power line can easily occur. If on a specific application the real load is less than 100 pF (for example 50 pF), and WP/WN remains unchanged, the noise does not decrease because the rise/fall time ts will be less than 2 ns. Reducing $C_{load}$ can therefore produce an even larger amount of noise. If on a specific application the real load is less than 100 pF (again for example 50 pF), a reduction of WP/WN in order to produce the same rise/fall time ts results in a power line noise reduction of about 50% without affecting switching performance.

Figure 2:
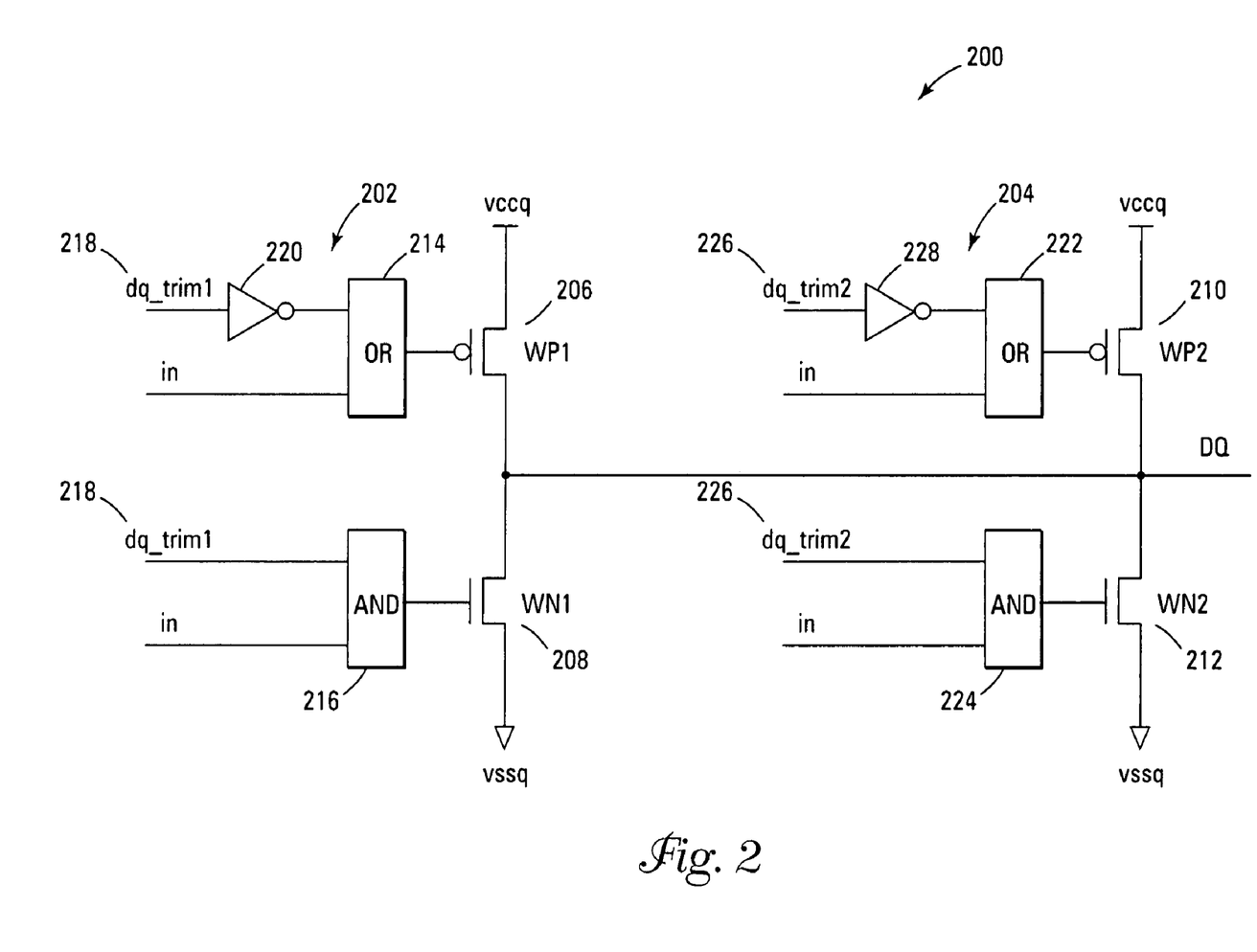
FIG. 2 is a circuit diagram of an output buffer according to another embodiment of the present invention.

The embodiments of the present invention provide methods and apparatus for trimming the sizes WP/WN of an integrated circuit output buffer. In one embodiment, output buffer transistors 110 and 112 are arranged using multiple CMOS stages in parallel as shown in FIG. 2. While only two stages are shown, it should be understood that more stages are easily implementable by one of skill in the art, and are within the scope of the invention.

For example, Flash memories assembled in cellular phone platforms typically have a broad range of interconnect parasitic values. The impedance of the output buffers of Flash devices may not match the requirements of any specific application. While the rise and fall times of output buffers are generally specified for an output load of 30 pF, the capacitive load of real systems can be on the order of 15 pF or less. Test machines at a memory manufacturer's site generally exhibit a significantly larger load capacitance, generally on the order of 50–100 pF. In one embodiment, the output driver strength of a Flash memory can be configured at different levels using programmable/erasable bits or using information stored in volatile latches, to match a wide range of load capacitances. This configuration ensures fast switching speed with small output noise and power consumption at the application level and also in a probe or testing environment.

FIG. 2 is a circuit diagram of an output buffer configuration 200 according to one embodiment of the present invention. Output buffer 200 has two stages 202 and 204. Stage 202 comprises a CMOS structure having p-channel transistor 206 with size WP1 and n-channel transistor 208 with size WN1. Stage 204 comprises a CMOS structure having p-channel transistor 210 with size WP2 and n-channel transistor 212 with size WN2. A signal is presented to the gates of each of the stage 202 transistors. The transistor 206 receives a signal from OR gate 214. OR gate 214 receives as inputs an input data signal and an enable signal dq_trim1 218. Enable signal 218 is inverted with inverter 220 before being input to OR gate 214. The transistor 208 receives a signal from AND gate 216. AND gate 216 receives as inputs the input data signal and the enable signal dq_trim1 218.

Stage 204 is constructed similarly to stage 202, having transistors 210 and 212 fed by OR gate 222 and AND gate 224, respectively. OR gate 222 has as its inputs the data signal and the enable signal dq_trim2 226 which is first inverted with inverter 228. AND gate 224 has as its inputs the data signal and the enable dq_trim2 signal 226.

The stages 202 and 204 provide multiple selectable options for output buffer sizes through selection of the dq_trim signals. The final WP or WN values for output buffer 200, depending upon the enable signals, are the sums of the respective stage transistors that are enabled. When stage 202 is enabled, the WP or WN values are WP1 or WN1. When stage 204 is enabled, the WP or WN values are WP2 or WN2. When both stages are enabled, the WP and WN values are the sum of the values, WP=WP1+WP2, and WN=WN1+WN2. It should be understood that two stages are shown for simplicity and the purposes of illustration only, and that additional stages result in additional choices for determining the size of the output buffers. As such, the invention is not limited to two stages.

Figure 3:
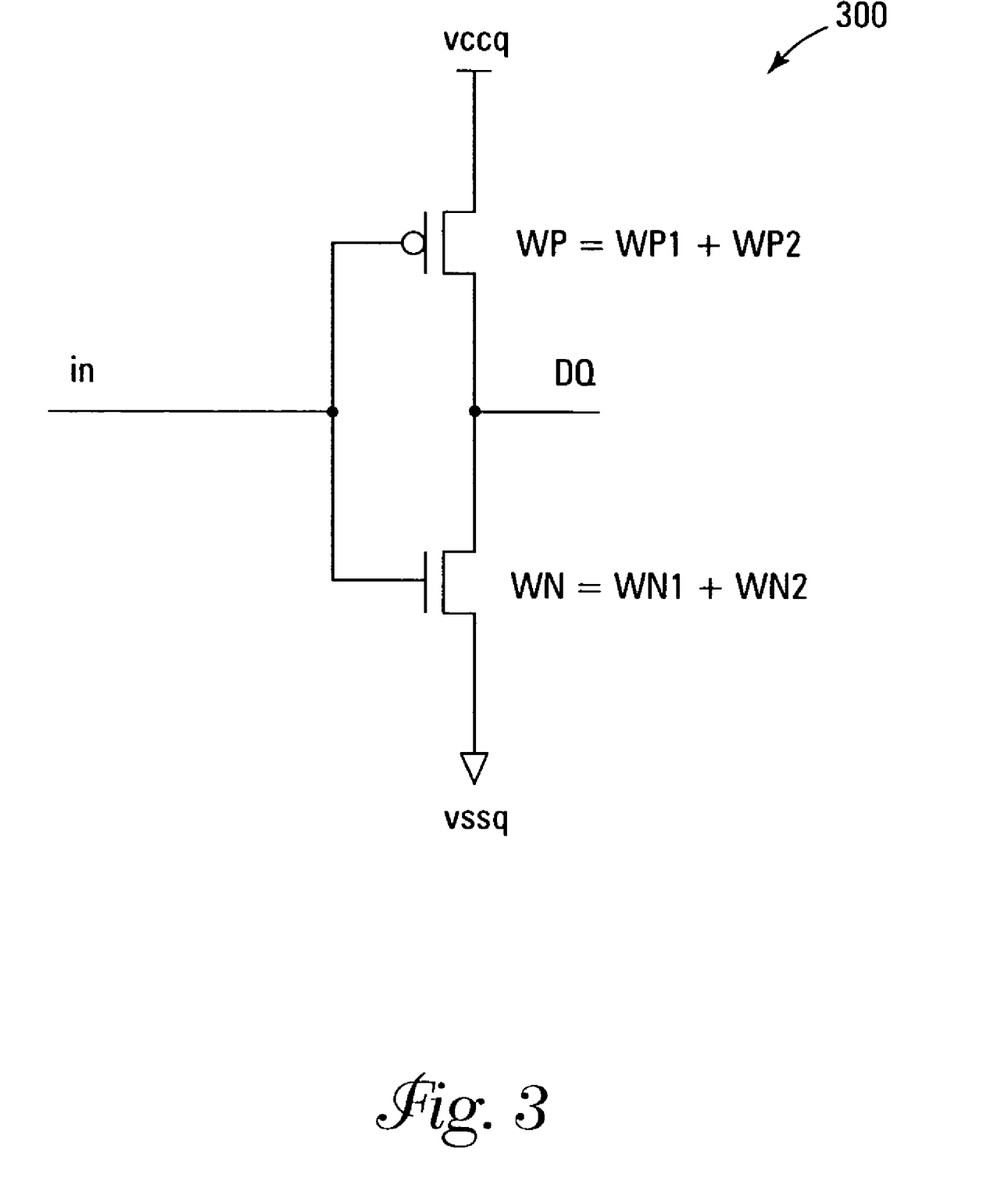
FIG. 3 is a circuit diagram of an equivalent circuit to one configuration of the embodiment of FIG. 2.

FIG. 3 is a circuit diagram representation of an equivalent output buffer structure 300 when both stages 202 and 204 of output buffer 200 are enabled.

Table 1 contains the possible combinations of dq_trim1 and dq_trim2 signals, and the resulting output buffer possibilities. Each of the allowable configurations as shown in Table 1 are in various embodiments designed to meet specified rise/fall times ts.

TABLE 1

| dq_trim1 | dq_trim2 | WP | WN |
|---|---|---|---|
| 1 | 1 | WP1 + WP2 | WN1 + WN2 |
| 1 | 0 | WP1 | WN1 |
| 0 | 1 | WP2 | WN2 |
| 0 | 0 | not allowed | not allowed |

Table 2 shows approximate capacitance load values consistent with the requirement that ts must be less than a specified value, e.g., ts<3 ns, for various choices of WP and WN.

TABLE 2

| WP | WN | Cload |
|---|---|---|
| WP1 + WP2 | WN1 + WN2 | 100 pF |
| WP2 | WN2 | 50 pF |
| WP1 | WN1 | 30 pF |

Trimming of the output buffer size is accomplished in various embodiments in different ways. For example, two ways to trim the output buffer size using the configurations described above are described below. The first uses fuses, a non-volatile technique to generate the dq_trim signals to select different output stages. The second uses latches, a volatile technique to generate the dq_trim signals to select different output stages.

The first technique uses fuses to store the value of the dq_trim1 and dq_trim2 signals. In one embodiment, the fuses are implemented in chips containing Flash electrically erasable programmable read only memory (EEPROM) chips. The choice of fuse structure is well known in the art, and it should be understood that different fuses such as laser fuses and the like may be used without departing from the scope of the invention. Using fuses allows the manufacturer of the integrated circuit employing the output buffer to permanently set at manufacture an output trim configuration according to desired customer needs.

The second technique uses latches that are loaded with a desired configuration every time the customer wishes to use the integrated circuit. The customer decides whether to use this optional configuration to trim the strength of the output buffer according to the application for which the integrated circuit is to be used.

Figure 4:
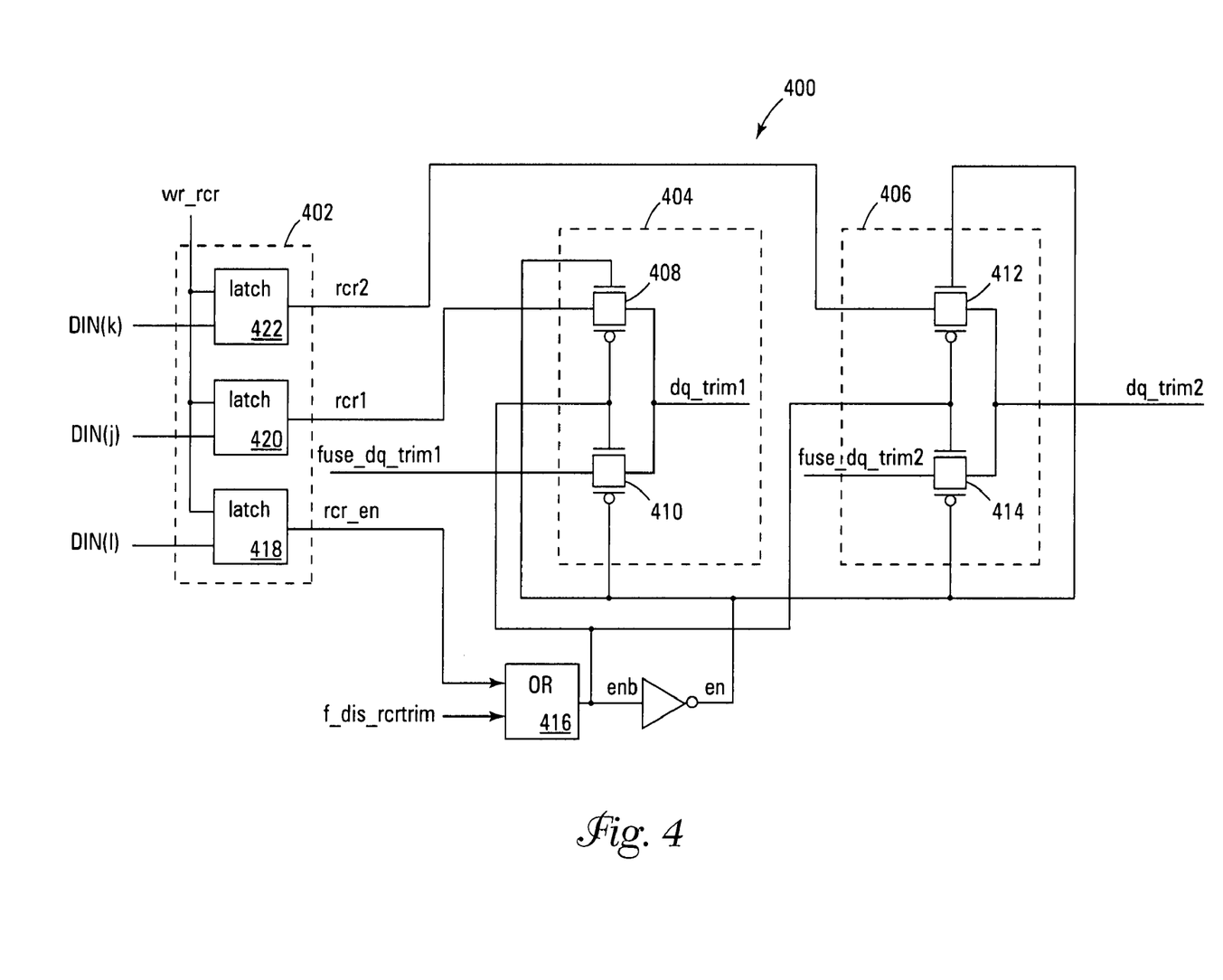
FIG. 4 is a block diagram of control logic for an output buffer according to another embodiment of the present invention.

FIG. 4 is a diagram showing one embodiment of control logic for output buffer strength trimming. In circuit 400, a bank of latches 402 is used to store information. In one embodiment, the bank of latches 402 is configured with the same structure and operation as a read configuration register (rcr), the structure and operation of which are well known in the art.

The circuit 400 produces dq_trim signals for enabling the various stages 404 and 406 of a multiple stage output buffer according to parameters of operation determined at manufacture, by application, or both. In this embodiment, each of the stages 404 and 406 comprises two CMOS transfer gates, stage 404 having transfer gates 408 and 410, and stage 406 having transfer gates 412 and 414. Depending upon the configuration desired by a user, either the fuse_dq_trim signals will be used by the stages, or the rcr signals generated by latch bank 402 will be used. Fuses fuse_dq_trim1 and fuse_dq_trim2 are set during manufacturing to provide a standard capacitive load if enabled. A fuse such as those described above sets the operation mode of the circuit 400. The signal from that fuse is f_dis_rcrtrim, which is an input to OR gate 416.

If the fuse f_dis_rcrtrim has value 1 (which is its default value in one embodiment), the signal en is 0 and enb is 1. The signals dq_trim1 and dq_trim2 are in this configuration connected to fuses fuse_dq_trim1 and fuse_dq_trim2, and provide a permanent output drive strength setting associated with a specific capacitive load. The output buffer strength is permanently set by the fuses. In this configuration, the customer does not have the ability to use the latches to trim the output buffer strength.

In another configuration, the fuse f_dis_rcrtrim is programmed during the manufacturing process to a value of 0. In this configuration, the user has the option of trimming the output buffer strength as desired using the three latches rcr_en (enable latch 418) and rcr1 and rcr2 (trim latches 420 and 422). If the user does not want to apply functionality of using the latches to selectively enable various output buffer stages to adjust the output driver strength, then the rcr_en latch 418 is not programmed. The value of rcr_en is then at its default of 1, and dq_trim1 and dq_trim1 are connected to fuse_dq_trim1 and fuse_dq_trim2 respectively as described above.

If the user desires to selectively adjust the output buffer strength of the multiple stage buffer, using the latches to trim the output driver strength, the rcr_en latch 418 is programmed to a value of 0. Latches 420 and 422 generating outputs rcr 1 and rcr 2 respectively are programmed with values DIN(j) and DIN(k). The respective outputs from latches 420 and 422 are connected to CMOS components 408 and 412 respectively. The OR gate 416 output is 0, so enb is 0 and en is 1. The signal rcr_en is then 0, and dq_trim1 and dq_trim2 are connected to latches rcr1 and rcr2 respectively. The latch values are used to adjust the strength of the output buffer as desired. Default power up values for rcr1 and rcr2 are 1. In this configuration, the CMOS components 408 and 412 of stages 404 and 406 are enabled, and depending upon the rcr1 and rcr2 values, either or both of the stages are enabled, resulting in a selectable output buffer size.

Output buffer strength trimming is static in the sense that the buffer strength is set for a given $C_{load}$. No feedback from actual rise/fall time is used to trim the output strength. Trimming on a permanent basis as discussed above is configured permanently if fuse f_dis_rcrtrim is programmed to a 1 value. This is set after the rise/fall time performances and $C_{load}$ are known. Trimming is optionally set up using latches 420 and 422 programmed by the user for a specific rise/fall time performances and PCB load.

It should be understood that enabling the signals f_dis_rcrtrim, rcr_en, and the like can be accomplished in a number of ways, and that such enablement is within the scope of one of skill in the art. Further, the embodiments of the present invention, while described with respect to two output stages, are scalable to greater than two output buffer stages. As the number of stages increases, the area on an integrated circuit also increases, but the number of stages is not limited.

The embodiments of the present invention use no feedback from rise/fall time of the circuit. There is no internal monitoring of the rise/fall time. For example, to drive C of 10 pF with a desired rise time of 5 ns, the WP/WN values are assigned to make the buffer strength to yield a 5 ns rise time when driving 10 pF capacitive load. No adaptive monitoring and adjustment of the rise time is required or necessary.

Figure 5:
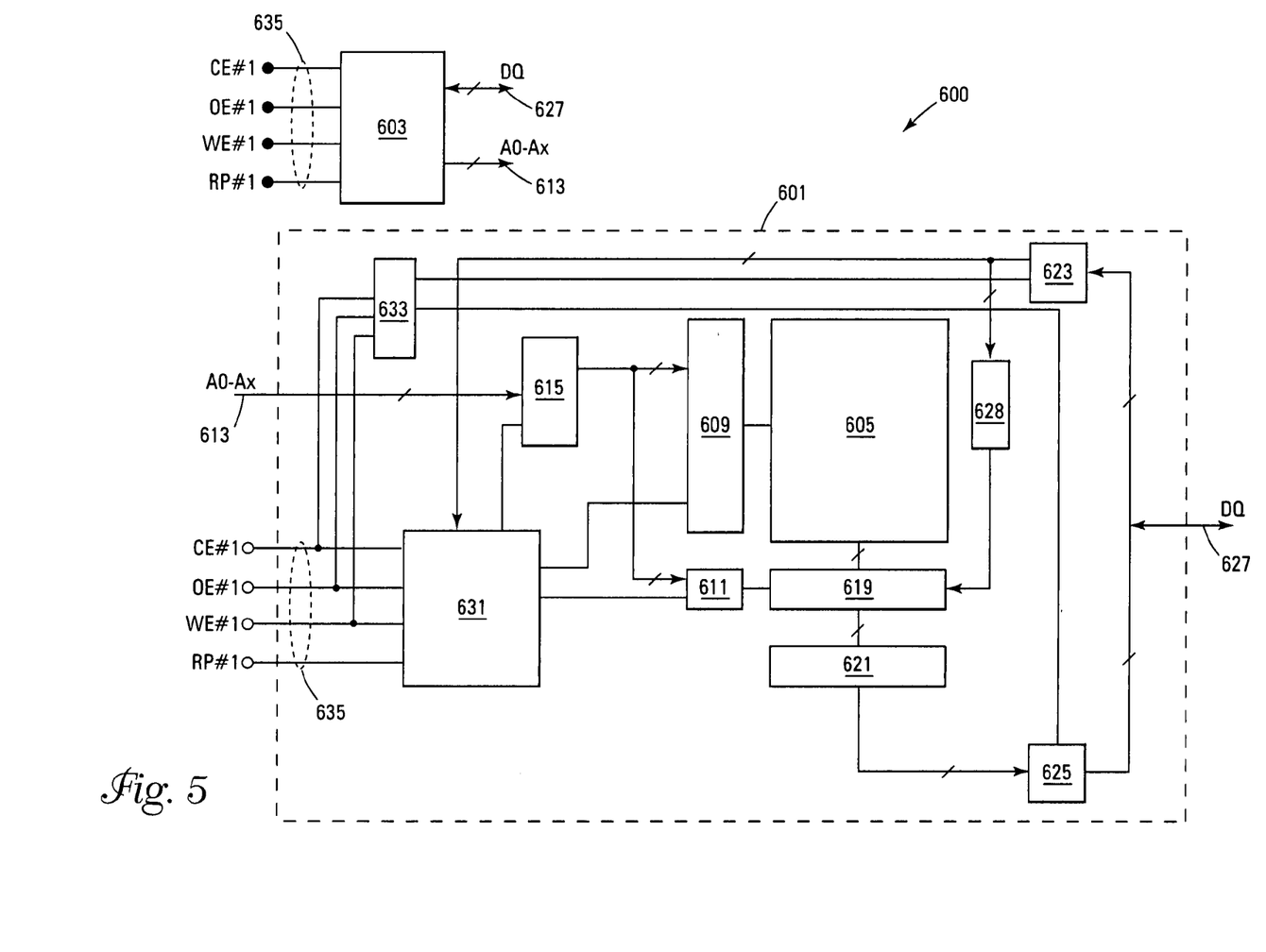
FIG. 5 is a functional block diagram of a basic flash memory device that is coupled to a processor in accordance with an embodiment of the invention.

FIG. 5 is a functional block diagram of a basic flash memory device 601 that is coupled to a processor 603. The memory device 601 and the processor 603 may form part of an electronic system 600. The memory device 601 has been simplified to focus on features of the memory that are helpful in understanding the present invention. The memory device 601 includes an array of memory cells 605.

The memory cells may be non-volatile floating-gate memory cells arranged in rows and columns, with the rows often arranged in blocks. A memory block is some discrete portion of the memory array 605. The memory cells generally can be erased in blocks. Data, however, may be stored in the memory array 605 separate from the block structure.

A row decoder 609 and a column decoder 611 are provided to decode address signals provided on address lines A0-Ax 613. An address buffer circuit 615 is provided to latch the address signals. Address signals are received and decoded to access the memory array 605. Column select circuitry 619 is provided to select one or more columns of the memory array 605 in response to control signals from the column decoder 611. Sensing circuitry 621 is used to sense and amplify data stored in the memory cells. Data input 623 and output 625 buffers are included for bidirectional data communication over a plurality of data (DQ) lines 627 with the processor 603. The DQ lines 627 provide access to data values of memory cells of the memory array 605. A data latch 628 is typically provided between data input buffer 623 and the memory array 605 for storing data values (to be written to a memory cell) received from the DQ lines 627. Data amplified by the sensing circuitry 621 is provided to the data output buffer 625 for output on the DQ lines 627. The data output buffer 625 includes at least one output buffer circuit in accordance with an embodiment of the invention.

Command control circuit 631 decodes signals provided on control lines 635 from the processor 603. These signals are used to control the operations on the memory array 605, including data read, data write, and erase operations. Input/output control circuit 633 is used to control the data input buffer circuit 623 and the data output buffer circuit 625 in response to some of the control signals. As stated above, the flash memory device 601 has been simplified to facilitate a basic understanding of the features of the memory. A more detailed understanding of flash memories is known to those skilled in the art. As is well known, such memory devices 601 may be fabricated as integrated circuits on a semiconductor substrate.

CONCLUSION

The various embodiments of the present invention provide apparatus and methods for adjusting the strength of an output buffer. Each of multiple stages of an output buffer may be enabled, and each enabled stage adds to the strength of the output buffer. The output buffer contains a bank of latches for programming the enable values to enable at a user's specification appropriate stages for providing an output buffer strength suitable to the capacitive load of the application.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An output buffer, comprising:
   a first stage and a second stage, the first and second stages having outputs connected parallel to one another, the first stage providing buffer strength when a first stage enable signal is active, and the second stage providing buffer strength when a second stage enable signal is active;
   wherein each output stage comprises:
      a complementary metal oxide semiconductor (CMOS) structure having a p-channel MOS device and an n-channel MOS device;
      an AND gate having an output connected to a gate of the n-channel transistor, and having two inputs, an input connected to a data signal and another input connected to one of a plurality of enable signals; and
      an OR gate having an output connected to a gate of the p-channel transistor, and having two inputs, an input connected to the data signal and another input connected to a complement of the one of the plurality of enable signals; and
   a bank of latches, the bank of latches having an enable latch and two or more trim latches, each trim latch storing a value representative of an enable signal, each trim latch connected to the respective enable input of one the plurality of output stages to provide its enable signal to its respective output stage.

2. The output buffer of claim 1, wherein each output stage further comprises:
   a second CMOS structure substantially identical to the first CMOS structure, the second CMOS AND gate inputs connected to the data signal and to one of a plurality of hard coded enable signals, and the second CMOS OR gate inputs connected to the data signal and to a complement of the one of the plurality of hard coded enable signals.

3. The output buffer of claim 2, and further comprising:
   an output buffer selection circuit, comprising an OR gate connected to the enable latch output and to a general enable signal, the OR gate output connected to the complement of the enable signal to enable a predetermined output buffer strength when either the enable latch output or the general enable signal are active.

4. An output buffer, comprising:
   a first stage and a second stage, the first and second stages having outputs connected parallel to one another, the first stage providing buffer strength when a first stage enable signal is active, and the second stage providing buffer strength when a second stage enable signal is active; and
   an output buffer trim circuit, the trim circuit comprising:
   a bank of latches, the bank of latches having an enable latch and a plurality of trim latches, each trim latch storing a value representative of an enable signal, each trim latch connected to a respective enable input of one the plurality of output stages to provide its enable signal to its respective output stage.

5. An output buffer, comprising:
   at least two parallel buffer stages, each stage activated upon receipt of a respective stage enable signal, the stages providing a range of output buffer strengths cumulatively to a total output buffer strength, wherein each output stage comprises:
      a pair of CMOS components, the first CMOS component connected to a non-volatile buffer strength signal, and the second CMOS component connected to a selectable variable buffer strength signal; and
      selection circuitry to select either the first CMOS component or the second CMOS component.

6. An output buffer, comprising:
   at least two parallel buffer stages, each stage activated upon receipt of a respective stage enable signal, the stages providing a range of output buffer strengths cumulatively to a total output buffer strength, wherein each output stage comprises:
      a pair of CMOS components, the first CMOS component connected to a hard coded buffer strength signal, and the second CMOS component connected to a selectable buffer strength signal; and
   selection circuitry to select either the first CMOS component or the second CMOS component;
   wherein the selection circuitry comprises:
   a bank of latches, the bank of latches providing a plurality of enable signals, each enable signal for one of the second CMOS components of the plurality of the stages;
   wherein the bank of latches further comprises an enable latch to enable the plurality of enable signals.

7. An output buffer circuit, comprising:
   a first output buffer stage for providing an output buffer strength in response to a first stage enable signal; and
   at least one second output buffer stage, wherein each second output buffer stage is adapted to selectively provide additional buffer strength in response to a respective second stage enable signal, wherein each output stage comprises:
      a pair of CMOS components, the first CMOS component connected to a non-volatile buffer strength signal, and the second CMOS component connected to a selectable variable buffer strength signal; and
      selection circuitry to select either the first CMOS component or the second CMOS component.

8. An output buffer circuit, comprising:
   a plurality of output stages, each output stage selectable to provide a component of a total output buffer strength, each output stage comprising:
      a pair of CMOS components, the first CMOS component connected to a non-volatile buffer strength enable signal, and the second CMOS component connected to a selectable variable buffer strength enable signal; and
      selection circuitry to select either the first CMOS component or the second CMOS component.

9. An output buffer circuit, comprising:
   a plurality of output stages, each output stage selectable to provide a component of a total output buffer strength, each output stage comprising:
      a pair of CMOS components, the first CMOS component connected to a hard coded buffer strength enable signal, and the second CMOS component connected to a selectable buffer strength enable signal; and
   selection circuitry to select either the first CMOS component or the second CMOS component;
   wherein the selection circuitry comprises:
   a bank of latches, the bank of latches providing a plurality of enable signals, each enable signal for one of the second CMOS components of the plurality of the stages; and
   wherein the bank of latches further comprises an enable latch to enable the plurality of enable signals.

10. An output buffer, comprising:
a first stage and a second stage, the first and second stages parallel to each other, the first stage comprising:
   a first stage complementary metal oxide semiconductor (CMOS) structure having a p-channel MOS device and an n-channel MOS device;
   a first OR gate having an output connected to a gate of the p-channel transistor, and having two inputs, an input connected to a data signal and another input connected to an enable signal; and
   a first AND gate having an output connected to a gate of the n-channel transistor, and having two inputs, an input connected to the data signal and another input connected to the enable signal;
the second stage comprising:
   a second stage CMOS structure having a p-channel MOS device and an n-channel MOS device;
   a second OR gate having an output connected to a gate of the p-channel transistor, and having two inputs, an input connected to a data signal and another input connected to an enable signal; and
   a second AND gate having an output connected to a gate of the n-channel transistor, and having two inputs, an input connected to the data signal and another input connected to the enable signal; and
an output buffer trim circuit, the trim circuit comprising:
   a pair of trim latches, each storing a value representative of an enable signal, each trim latch connected to a respective enable input of one the first or the second stages to provide its enable signal to its respective output stage.

11. The output buffer of claim 10, wherein each of the first and the second stages further comprises:
a hard coded CMOS structure substantially identical to the first CMOS structure, the hard coded CMOS AND gate inputs connected to the data signal and to one of a plurality of hard coded enable signals, and the hard coded CMOS OR gate inputs connected to the data signal and to a complement of the one of the plurality of hard coded enable signals.

12. The output buffer of claim 11, and further comprising:
an output buffer enable selection circuit to select either the first and second stage CMOS structures or the hard coded CMOS structures.

13. The output buffer of claim 12, wherein the output buffer enable selection circuit comprises:
an OR gate having inputs connected to each of the enable latch output and a general enable signal, and having an output connected to the complement of the enable signal to enable a predetermined output buffer strength when either the enable latch output or the general enable signal are active, and to enable the trim latch enable signals when the enable latch output and the general enable signal are inactive.

14. A trim circuit for an output buffer having multiple parallel connected output stages, comprising:
a bank of latches, the bank of latches having an enable latch and a plurality of trim latches, each trim latch storing a value representative of an enable signal, each trim latch connected to a respective enable input of one of the output stages to provide its enable signal to its respective output stage; and
selection circuitry to select either the bank of latches or a preprogrammed enable signal.

15. The trim circuit of claim 14, wherein the selection circuitry comprises:
an OR gate having inputs connected to each of the enable latch output and a general enable signal, and having an output connected to the complement of the enable signal to enable a predetermined output buffer strength when either the enable latch output or the general enable signal are active, and to enable the trim latch enable signals when the enable latch output and the general enable signal are inactive.

16. A memory device, comprising:
an array of memory cells;
a plurality of data lines for access to the memory cells; and
an output buffer coupled between the array of memory cells and the plurality of data lines, wherein the output buffer comprises:
   a first stage and a second stage, the first and second stages having outputs connected parallel to one another, the first stage providing buffer strength when a first stage enable signal is active, and the second stage providing buffer strength when a second stage enable signal is active; and
   a bank of latches, the bank of latches having an enable latch and two trim latches, each trim latch storing a value representative of an enable signal, each trim latch connected to the respective enable input of one the plurality of output stages to provide its enable signal to its respective output stage.

17. The memory device of claim 16, wherein each output stage further comprises:
a second CMOS structure substantially identical to the first CMOS structure, the second CMOS AND gate inputs connected to the data signal and to one of a plurality of hard coded enable signals, and the second CMOS OR gate inputs connected to the data signal and to a complement of the one of the plurality of hard coded enable signals.

18. The memory device of claim 17, wherein the output buffer further comprises:
an output buffer selection circuit, comprising an OR gate connected to the enable latch output and to a general enable signal, the OR gate output connected to the complement of the enable signal to enable a predetermined output buffer strength when either the enable latch output or the general enable signal are active.

19. A memory device, comprising:
an array of memory cells;
a plurality of data lines for access to the memory cells; and
an output buffer coupled between the array of memory cells and the plurality of data lines, wherein the output buffer comprises a first stage and a second stage, the first and second stages having outputs connected parallel to one another, the first stage providing buffer strength when a first stage enable signal is active, and the second stage providing buffer strength when a second stage enable signal is active; and an output buffer trim circuit, the trim circuit comprising:
a bank of latches, the bank of latches having an enable latch and a plurality of trim latches, each trim latch storing a value representative of an enable signal, each trim latch connected to a respective enable input of one the plurality of output stages to provide its enable signal to its respective output stage.

20. The memory device of claim 19, wherein the array of memory cells comprises an array of non-volatile memory cells.

21. A system, comprising:
a processor;
a memory device coupled to the processor, the memory device comprising:
an array of memory cells;
a plurality of data lines for access to the memory cells; and
an output buffer coupled between the array of memory cells and the plurality of data lines, wherein the output buffer comprises:
a first stage and a second stage, the first and second stages having outputs connected parallel to one another, the first stage providing buffer strength when a first stage enable signal is active, and the second stage providing buffer strength when a second stage enable signal is active; and
a bank of latches, the bank of latches having an enable latch and two trim latches, each trim latch storing a value representative of an enable signal, each trim latch connected to the respective enable input of one the plurality of output stages to provide its enable signal to its respective output stage.

22. The memory device of claim 21, wherein each output stage further comprises:
a second CMOS structure substantially identical to the first CMOS structure, the second CMOS AND gate inputs connected to the data signal and to one of a plurality of hard coded enable signals, and the second CMOS OR gate inputs connected to the data signal and to a complement of the one of the plurality of hard coded enable signals.

23. The memory device of claim 22, wherein the output buffer further comprises:
an output buffer selection circuit, comprising an OR gate connected to the enable latch output and to a general enable signal, the OR gate output connected to the complement of the enable signal to enable a predetermined output buffer strength when either the enable latch output or the general enable signal are active.

24. A method for adjusting a strength of an output buffer, comprising:
generating enable signals for a plurality of parallel output buffer stages;
enabling each stage having an enable signal; and
combining the strength of each enabled stage into a total buffer strength; wherein generating enable signals comprises:
programming a bank of trim latches with a plurality of values representative of enable signals; and
connecting an output of each trim latch to a respective output buffer stages.

25. The method of claim 24, wherein combining the strength comprises connecting the plurality of output buffer stages in parallel.

26. The method of claim 24, wherein each enabled output buffer stage contributes to a total strength of the output buffer.

27. The method of claim 24, wherein selectively enabling comprises:
providing an enable signal to each of the at least one buffer stage, wherein each enable signal is stored in a latch; and
enabling each output stage for which its enable signal is active.

28. The method of claim 24, wherein selectively enabling at least one output buffer stage comprises:
providing a first enable signal to a first enable input of each of the output stages;
providing a second signal to a second enable input of each of the output stages; and
selecting between the first and the second enable signal and the selectable signal.

29. A method of adjusting output buffer strength in a multiple stage output buffer, comprising:
selecting predetermined non-volatile or programmable variable enable inputs for the output stages;
programming the programmable variable enable inputs when programmable variable enable inputs are selected; and
passing the predetermined non-volatile enable inputs when predetermined non-volatile enable inputs are selected.

30. A method of operating an integrated circuit, comprising:
programming a selectable input fuse to generate an active selectable input enable signal;
programming a predetermined non-volatile enable signal set;
programming a selectable variable input set; and
selecting between the predetermined non-volatile enable set and the selectable variable input set.

31. The method of claim 30, wherein selecting comprises:
combining in an OR gate the selectable input enable signal and an input select enable signal;
providing the selectable input set to a plurality of output buffer stages when the input select enable signal is active; and
providing the predetermined enable signal set when the input select enable signal is inactive.

* * * * *